(12) United States Patent
Gerlach

(10) Patent No.: US 7,119,702 B2
(45) Date of Patent: Oct. 10, 2006

(54) AUDIBLE RELAY EMULATOR

(75) Inventor: Ronald R. Gerlach, Orange, CA (US)

(73) Assignee: ADC DSL Systems, Inc., Eden Prairie, MN (US)

( * ) Notice: Subject to any disclaimer, the term of this patent is extended or adjusted under 35 U.S.C. 154(b) by 562 days.

(21) Appl. No.: 10/108,006

(22) Filed: Mar. 27, 2002

(65) Prior Publication Data

US 2003/0202670 A1    Oct. 30, 2003

(51) Int. Cl.
    *G08B 21/00*    (2006.01)
(52) U.S. Cl. .................. 340/644; 340/692; 370/244
(58) Field of Classification Search ............... 340/644, 340/692, 3.43, 3.8, 638, 639, 686.1; 370/244, 370/389; 335/1, 17; 381/123
See application file for complete search history.

(56) References Cited

U.S. PATENT DOCUMENTS

| | | | | |
|---|---|---|---|---|
| 3,973,087 A * | 8/1976 | Fong | ..................... | 340/310.06 |
| 4,003,011 A * | 1/1977 | Hayden | ..................... | 335/196 |
| 5,283,816 A * | 2/1994 | Gomez Diaz | ................ | 379/40 |
| 5,646,602 A * | 7/1997 | Gertz et al. | ............ | 340/825.25 |
| 6,005,694 A * | 12/1999 | Liu | ................................ | 398/6 |
| 6,217,448 B1 * | 4/2001 | Olsen | ........................... | 463/25 |
| 6,259,692 B1 * | 7/2001 | Shtivelman et al. | ......... | 370/352 |
| 6,330,306 B1 * | 12/2001 | Brown | ........................ | 379/21 |
| 6,477,288 B1 * | 11/2002 | Sato | ............................. | 385/16 |
| 6,859,539 B1 * | 2/2005 | Maeda | ........................ | 381/86 |

* cited by examiner

*Primary Examiner*—Phung T. Nguyen
(74) *Attorney, Agent, or Firm*—Fogg and Associates LLC; Scott V. Lundberg

(57) ABSTRACT

A device to audibly verify the activation of a solid state relay. The device includes an audio output device that is coupled to the solid state relay to produce a sound when the solid state relay is activated. The sound produced by the audio output devices emulates the sound of an electromechanical relay when switched.

38 Claims, 4 Drawing Sheets

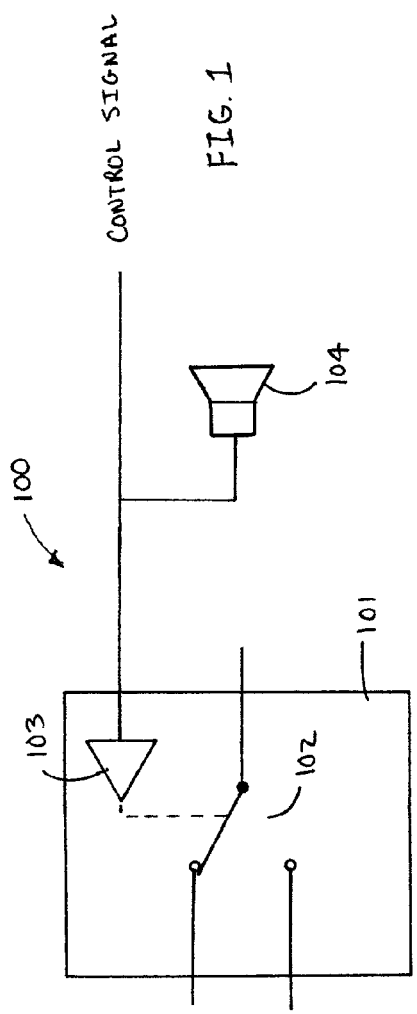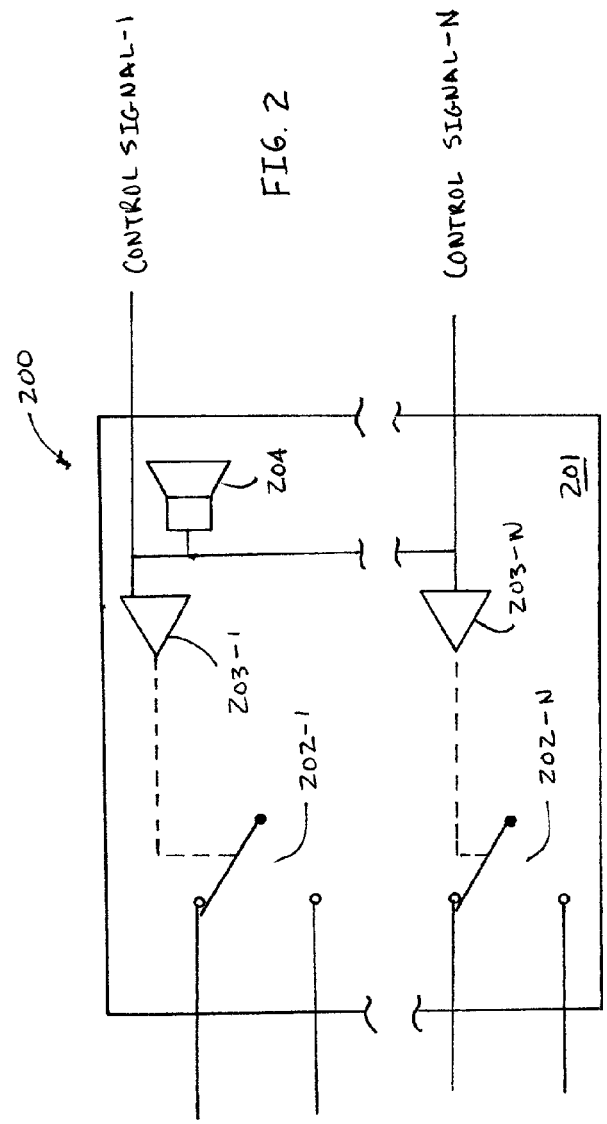

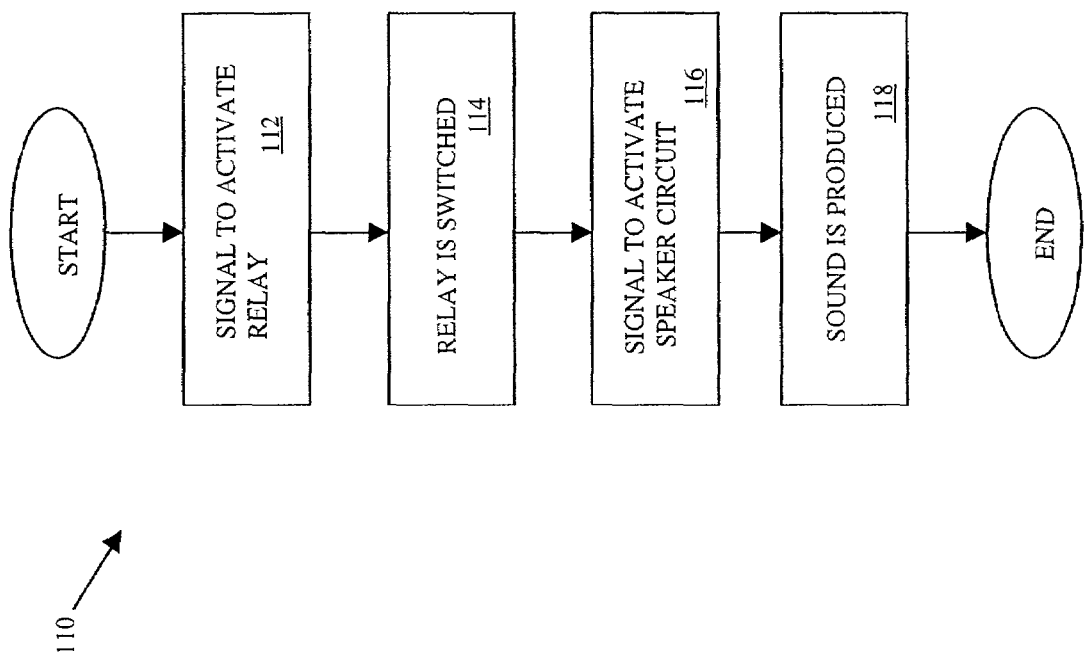

AUDIBLE RELAY EMULATOR

TECHNICAL FIELD

The present invention relates generally to the field of telecommunication switching devices and in particular a device that provides audible verification of the activation of solid state relay.

BACKGROUND

Telecommunication networks carry various types of information between users, e.g., voice, data, video. A typical telecommunications network includes many components or modules that work together to make a connection between users. For example, a telecommunications network typically includes switches, transport lines, terminals and other conventional equipment used to create transmission path connections between users.

Errors can occur in any one of these modules of the network creating a faulty transmission path. For example, a fiber optic cable that carries signals for the network can be cut inadvertently or otherwise damaged such that it cannot acceptably carry data. To prevent errors of this nature from hindering communications, networks include redundant or alternative components so that when a working component stops functioning acceptably, a redundant or alternative component can be switched into the network in place of the non-working component. Thus, the network is able to continue to carry information despite errors. This is referred to in the industry as network survivability.

Typically, relays are used as switches to selectively replace faulty components with the redundant or alternative components. For example, if a transmission path from a central office to a remote location is found to be faulty, relays in the central office and the remote location will be switched to replace the faulty transmission path with a redundant transmission path. An electromechanical relay will make a "clicking" sound when the relay has been activated (switched). Typically, the service technician will listen for the "clicking" sound to verify that the relay has been switched. It is desired in the industry to use solid state relays because they take up less space, are cheaper to make and are more reliable than electromechanical relays. However, solid state relays do not make a "clicking" sound when they are switched. Accordingly, the service technicians cannot rely on hearing the "clicking" sound in verifying if the relay has been switched.

For the reasons stated above and for other reasons stated below which will become apparent to those skilled in the art upon reading and understanding the present specification, there is a need in the art for a audible relay emulator.

SUMMARY

The above-mentioned problems with protection switching mechanisms in integrated circuits and other problems are addressed by the present invention and will be understood by reading and studying the following specification.

In one embodiment, a signal circuit comprises a solid state relay and a signal device. The signal device is coupled to the solid state relay to produce a signal when the solid state relay is activated.

In another embodiment, an audible relay emulator comprises one or more solid state relays and an audio output device. The audio output device is coupled to each of the solid state relays to produce a sound when one of the one or more solid state relays is activated.

In another embodiment, a network node that has an audible relay emulator circuit comprises one or more solid state relays and one or more audio output devices. The one or more solid state relays are housed in the network node. The one or more audio output devices are also housed in the network node. Moreover, each one of the one or more audio output devices is coupled to one or more of the one or more solid state relays to produce a sound when one of the one or more associated solid state relays is switched.

In another embodiment, a method of operating a solid state relay circuit comprises activating the solid state relay and producing a sound when the solid state relay is switched.

BRIEF DESCRIPTION OF THE DRAWINGS

The present invention can be more easily understood and further advantages and uses thereof more readily apparent, when considered in view of the description of the preferred embodiments and the following figures in which:

FIG. 1 is a block diagram of one embodiment of an audible relay emulator of the present invention;

FIG. 1A is a flow chart illustrating the steps to implement one embodiment of the present invention;

FIG. 2 is a block diagram of another embodiment of an audible relay emulator of the present invention;

In accordance with common practice, the various described features are not drawn to scale but are drawn to emphasize specific features relevant to the present invention. Reference characters denote like elements throughout Figures and text.

DETAILED DESCRIPTION

Figure 3:
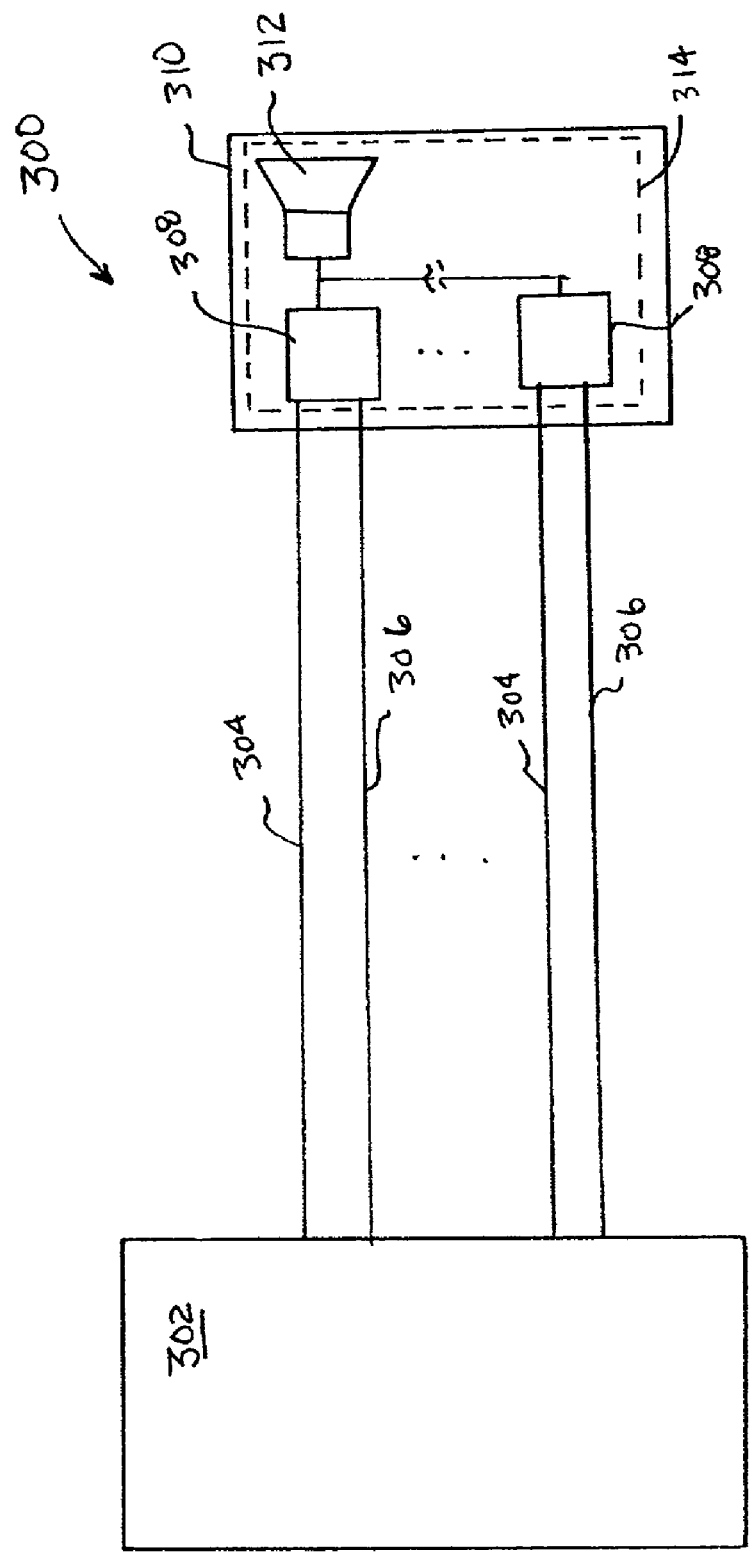
FIG. 3 is a block diagram of a communication system incorporating one embodiment of an audible relay emulator of the present invention.

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention provide a signal when a relay is activated. In one embodiment, an audible signal is produced that simulates the sound an electromechanical relay makes when it is switched. Referring to FIG. 1, one embodiment of an audible relay emulator 100 of the present invention is illustrated. As illustrated, the audible relay emulator 100 includes a solid state relay circuit 101 and an audio output device 104. The solid state relay circuit 101 includes a relay 102 and a buffer circuit 103. The buffer circuit 103 is used to buffer a control signal sent to drive the relay 102. In one embodiment, the audio output device 104 is a speaker circuit 104. As illustrated in FIG. 1, the speaker circuit 104 is coupled to the buffer 103. In one embodiment, the speaker circuit 104 is activated to produce an audible sound that indicates the relay 102 has been switched by the control signal sent to the buffer circuit 103. In another embodiment, a signal is sent from the buffer circuit 103 to the speaker circuit 104 to activate the speaker circuit 104 when the relay 102 is switched. In yet another embodiment, the speaker circuit 104 includes an amplifier to amplify the sound produced.

A flow cart 110 illustrating how one embodiment of the present invention is implemented is illustrated in FIG. 1A. As illustrated, a signal is sent to the relay 102 to activate (switch) the relay (112). The relay 102 is then switched (114). A signal is sent to the speaker circuit 104 indicating that the relay 102 has been switched (116). In response to the signal, the speaker circuit 104 produces a sound (118). As stated above, in one embodiment the sound emulates the sound an electromechanical relay makes when it is switched. However, in other embodiments, the speaker circuit 104 produces a pre-selected audible signal (like tones, words, etc.) to indicate when the relay 102 has been switched.

In the embodiment illustrated in FIG. 1, the speaker circuit 104 is illustrated as being in a separate location than the solid state relay 102. In another embodiment of an audible relay emulator 200 of the present invention, a speaker circuit 204 is housed on a circuit board 201 that includes one or more relays 202(1-N) and one or more buffers 203 (1-N) that are coupled to receive one or more control signals (1-N). This is illustrated in FIG. 2. As also illustrated in FIG. 2, speaker circuit 204 is coupled to produce an audible sound for more than one relay. That is, in this embodiment, speaker circuit 204 produces a sound when one or more relays in a group of relays 202 (1-N) are activated.

Referring to FIG. 3, an example of a communication system 300 employing an embodiment of the present invention is illustrated. The communication system 300 includes network nodes 302 and 300. The network nodes could include, an ADSL transmission unit-central office (ATU-C), a central office DSLAM, an integrated DLC, a remote DSLAM that is subtended from a DSLAM or an ATM switch, a remote access multiplexer subtended from a DSLAM or an ATM switch, or the like. In one embodiment, network node 302 is a central office 302 and network node 300 is a remote unit 310. Also illustrated in FIG. 3, are primary transmission paths 304 and alternative transmission paths 306 coupling the central office 302 to the remote unit 310. The remote unit 310 includes an embodiment of the audible relay emulator 314 that includes a plurality of relays 308 and a speaker circuit 312. If a primary transmission path 304 is determined to be faulty it is replaced with an associated alternative transmission path 306 by activating an associated relay 308. The speaker circuit 312 of the audible relay emulator 314 of the present invention produces a sound when relay 308 is switched for verification purposes.

Figure 4:
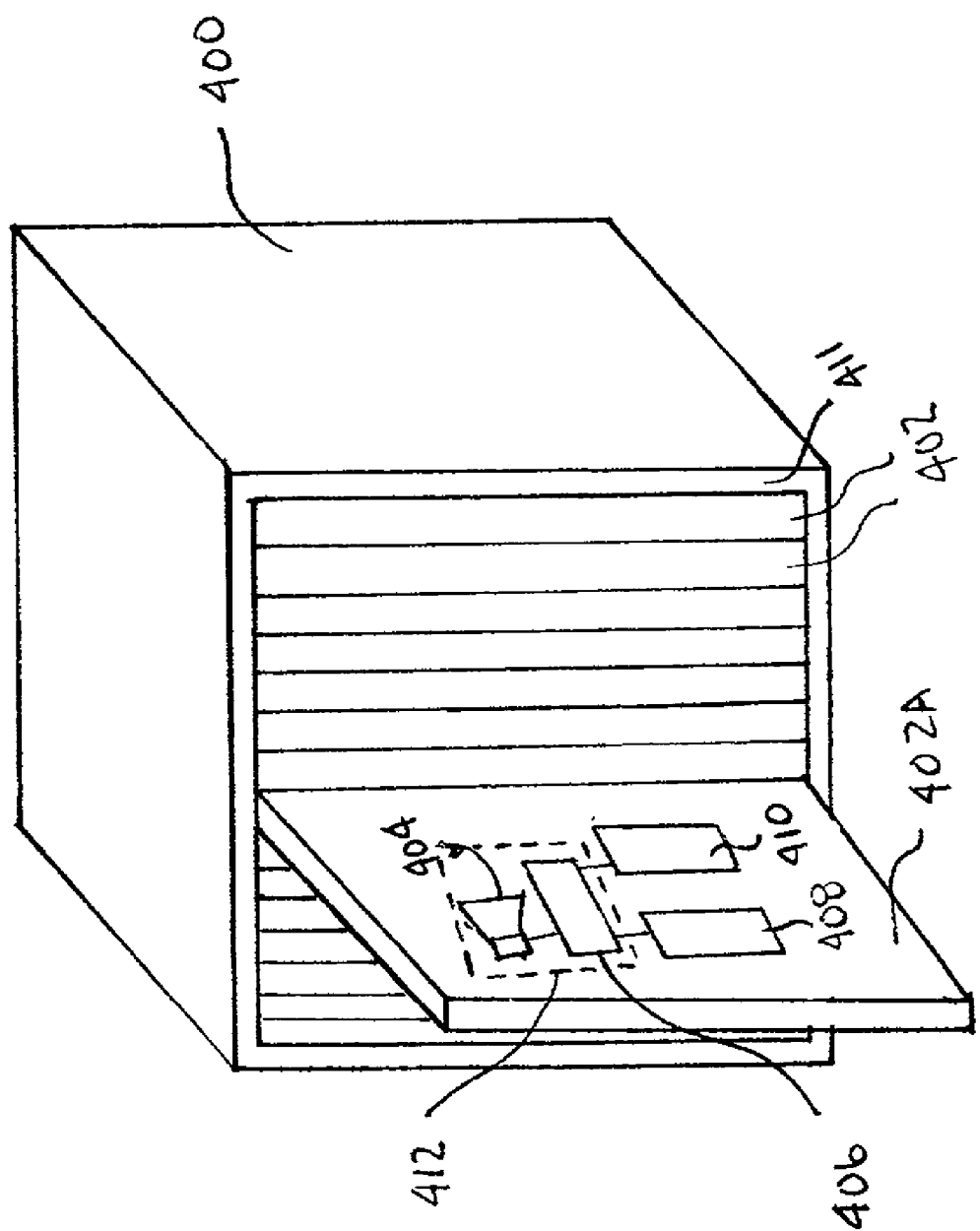
FIG. 4 is a perspective—block diagram of a remote unit incorporating one embodiment of an audible relay emulator of the present invention.

Another example of a use of the present invention is illustrated in FIG. 4. FIG. 4 illustrates a network node 400 with a plurality of circuit boards 402. In one embodiment, the network node is a remote unit 400. In this embodiment, remote circuit boards 402 contain circuits for operation of the remote unit 400. As illustrated in FIG. 4, one of the remote circuit boards (remote board 402A) includes primary operating circuit 408 and alternative operating circuit 410. Remote circuit board 402A is also shown including an embodiment of an audible relay emulator 412 of the present invention. The audible relay emulator 412 includes a solid state relay 406 and a speaker circuit 404. In use, if it is determined that the primary operating circuit 408 is defective, relay 406 of the audible relay emulator 412 is switched, so the alternative operating circuit 410 is used instead. Speaker circuit 404 produces a sound in response to the switching of the relay 406 for verification purposes.

As illustrated in the embodiment of FIG. 4, the speaker circuit 404 can be contained on the same remote circuit board 402A as the associated solid state relay 406. However, in another embodiment, a speaker circuit is contained on a different remote circuit board than an associated relay. Moreover, in yet another embodiment, a speaker circuit is mounted to a frame 411 of the network node 400.

The present invention has other applications such as testing computer systems, power switches and the like. Moreover, in addition to the above-described embodiments that use an audio output device to produce an audio signal when an electromechanical relay is activated, other types of signals could also be used. For example, a visual output device of a signal circuit could be used to provide a visual signal instead of an audio signal by an audio output device. That is, referring to FIG. 1, the audible relay emulator 100 could be replaced with an output signaling circuit 100 where the audio output device 104 is actually a visual output device 104 to produce a visual signal. Accordingly, the present invention is not limited to an audio signal.

What is claimed is:

1. An audible relay emulator comprising:
   one or more solid state relays; and
   an audio output device coupled to each of the solid state relays to produce a sound to indicate when one of the one or more solid state relays is activated in response to a user input.

2. The audible relay emulator of claim 1, wherein the sound emulates the sound of an electromechanical relay when activated.

3. The audible relay emulator of claim 1, wherein the sound produced by the audio output device is a tone.

4. The audible relay emulator of claim 1, wherein the sound produced by the audio output device is one or more words.

5. The audible relay emulator of claim 1, wherein the audio output device is not located on a circuit board that contains at least some of the one or more solid state relays.

6. The audible relay emulator of claim 1, wherein the audio output device further comprises:
   a amplifier coupled to amplify the sound.

7. The audible relay emulator of claim 1, wherein at least some of the one or more solid state relays are located on a single circuit board with the audio output device.

8. The audible relay emulator of claim 7, wherein the single circuit board is a remote board in a remote unit of a communication system.

9. The audible relay emulator of claim 8, further comprising:
   one or more buffer circuits, each buffer circuit coupled to buffer a control signal in activating an associated solid state relay.

10. The audible relay emulator of claim 9, wherein the control signal activates the audio output device.

11. The audible relay emulator of claim 9, wherein each of the one or more buffer circuits sends an associated signal to activate the audio output device after an associated solid state relay is activated.

12. A network node having an audible relay emulator circuit, comprising:
   one or more solid state relays housed in the network node; and one or more audio output devices housed in the network node, each one of the one or more audio output devices is coupled to one or more of the one or more solid state relays to produce a sound to indicate when one of the one or more associated solid state relays is switched to replace a first operating circuit with a second operating circuit.

13. The network node having an audible relay emulator circuit of claim 12, wherein the sound produced by the one or more audio output devices emulates the sound of an electromechanical relay when switched.

14. The network node having an audible relay emulator circuit of claim 12, wherein the sound produced by the one or more audio output devices is a tone.

15. The network node having an audible relay emulator circuit of claim 12, wherein the sound produced by the one or more audio output devices is one or more words.

16. The network node having an audible relay emulator circuit of claim 12, wherein the one or more solid state relays are contained on a circuit board with the one or more audio output devices.

17. The network node having an audible relay emulator circuit of claim 12, wherein at least one audio output device is contained on a different circuit board than at least one of an associated solid state relay.

18. The network node having an audible relay emulator circuit of claim 12, wherein at least one audio output device is connected to a frame of the network node.

19. An audible relay emulator comprising:
one or more solid state relays coupled to receive one or more control signals, wherein each of the control signals are adapted to activate an associated solid state relay to replace a first transmission path with an associated second transmission path; and
an audio output device coupled to receive the one or more control signals, wherein the audio output device produces a sound in response to receiving each of the one or more control signals to indicate activation of one of the one or more solid state relays.

20. The audible relay emulator of claim 19, further comprising:
one or more buffers, each buffer coupled between an associated control signal and an associated solid state relay to buffer the associated control signal in activating the associated solid slate relay.

21. The audible relay emulator of claim 19, wherein the sound the audio output device produces is the sound of an electromechanical relay when activated.

22. The audible relay emulator of claim 19, wherein the sound produced by the audio output device is a tone.

23. The audible relay emulator of claim 19, wherein the sound produced by the audio output device is one or more words.

24. The audible relay emulator of claim 19, wherein the audio output device is not located on a circuit board that contains at least some of the one or more solid state relays.

25. The audible relay emulator of claim 19, wherein the audio output device further comprises:
a amplifier coupled to amplify the sound.

26. The audible relay emulator of claim 19, wherein at least some of the one or more solid stare relays are located on a single circuit board with the audio output device.

27. The audible relay emulator of claim 26, wherein the single circuit board is a remote board in a remote unit of a communication system.

28. An output signaling circuit comprising:
one or more solid state relays;
a visual output device coupled to each of the solid state relays to produce a visual signal when one of the one or more solid state relays is activated; and
one or more buffer circuits, each buffer circuit coupled to buffer a control signal in activating an associated solid state relay.

29. The output signaling circuit of claim 28, wherein the visual output device is not located on a circuit board tat contains at least some of the one or more solid state relays.

30. The output signaling circuit of claim 28, wherein at least some of the one or more solid state relays are located on a single circuit board with the visual output device.

31. The output signaling circuit of claim 30, wherein the single circuit board is a remote board in a remote unit of a communication system.

32. The output signaling circuit of claim 28, wherein the control signal activates the audio output device.

33. The output signaling circuit of claim 28, wherein each of the one or more buffer circuits sends an associated signal to activate the visual output device after an associated solid state relay is activated.

34. A method of operating a solid state relay circuit comprising, the method comprising:
activating the solid state relay; and
producing a sound when the solid state relay has been switched to indicate activation of the solid state relay, wherein the sound produced emulates the sound made by an electromechanical relay when it is activated.

35. The method of claim 34, wherein activating the solid state relay further comprises:
sending a signal to the solid state relay to activate the solid state relay.

36. The method of claim 34, wherein producing a sound to indicate the solid state relay has been switched further comprises:
sending a signal from the solid state relay when the solid state relay is switched;
receiving the signal at an audio output device; and
producing the sound with the audio output device in response to the signal.

37. The method of claim 34, wherein the sound further comprises a tone.

38. The method of claim 34, wherein the sound further comprises one or more words.

* * * * *

UNITED STATES PATENT AND TRADEMARK OFFICE
CERTIFICATE OF CORRECTION

| | |
|---|---|
| PATENT NO. | : 7,119,702 B2 |
| APPLICATION NO. | : 10/108006 |
| DATED | : October 10, 2006 |
| INVENTOR(S) | : Gerlach |

It is certified that error appears in the above-identified patent and that said Letters Patent is hereby corrected as shown below:

At Claim 26, Column 6, Line 5, replace the first occurrence of "stare" with --state--

At Claim 29, Column 6, Line 19, replace the first occurrence of "tat" with --that--

Signed and Sealed this

Second Day of December, 2008

JON W. DUDAS
*Director of the United States Patent and Trademark Office*